United States Patent
Graf et al.

(10) Patent No.: US 9,818,653 B2
(45) Date of Patent: Nov. 14, 2017

(54) SEMICONDUCTOR TSV DEVICE PACKAGE TO WHICH OTHER SEMICONDUCTOR DEVICE PACKAGE CAN BE LATER ATTACHED

(71) Applicant: International Business Machines Corporation, Armonk, NY (US)

(72) Inventors: Richard Stephen Graf, Gray, ME (US); David Justin West, Essex Junction, VT (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 14/883,360

(22) Filed: Oct. 14, 2015

(65) Prior Publication Data

US 2016/0035632 A1    Feb. 4, 2016

Related U.S. Application Data

(62) Division of application No. 14/159,449, filed on Jan. 21, 2014.

(51) Int. Cl.
*H01L 21/00* (2006.01)
*H01L 21/66* (2006.01)
(Continued)

(52) U.S. Cl.
CPC ............ *H01L 22/10* (2013.01); *H01L 21/565* (2013.01); *H01L 23/49811* (2013.01); *H01L 24/83* (2013.01); *H01L 25/10* (2013.01); *H01L 25/18* (2013.01); *H01L 25/50* (2013.01); *H01L 22/14* (2013.01); *H01L 23/3128* (2013.01); *H01L 2224/16227* (2013.01); *H01L 2224/17181* (2013.01); *H01L 2224/48227* (2013.01);
(Continued)

(58) Field of Classification Search
CPC ....... H01L 2924/1431; H01L 23/49827; H01L 24/14; H01L 25/0657; H01L 2224/16146
USPC ........ 438/106, 107, 108, 109, 110, 125, 127
See application file for complete search history.

(56) References Cited

U.S. PATENT DOCUMENTS 6,897,125 B2    5/2005   Morrow et al.
6,924,551 B2    8/2005   Rumer et al.
(Continued)

FOREIGN PATENT DOCUMENTS

WO         2012052611 A1    4/2012

OTHER PUBLICATIONS

Non-final office action for U.S. Appl. No. 14/159,449 dated Sep. 27, 2016, 7 pp.
(Continued)

*Primary Examiner* — S. V. Clark
(74) *Attorney, Agent, or Firm* — Damion Jopsephs

(57) ABSTRACT

A first package includes a laminate layer, an overmold layer above and in direct contact with the laminate layer, and a logic circuit-through-silicon via (TSV) layer including a first logic die and TSVs. The logic circuit-TSV layer is within the overmold layer, and the TSVs are electrically exposed at a top surface of the overmold layer. The first package may be fabricated and tested by a first party prior to being provided to a second party. A second package includes a second logic die. The second party may attach the second package to the first package at the electrically exposed TSVs of the first package to realize a complete and functional semiconductor device.

12 Claims, 3 Drawing Sheets

(51) Int. Cl.
  *H01L 25/18*  (2006.01)
  *H01L 25/00*  (2006.01)
  *H01L 25/10*  (2006.01)
  *H01L 21/56*  (2006.01)
  *H01L 23/00*  (2006.01)
  *H01L 23/498* (2006.01)
  *H01L 23/31*  (2006.01)

(52) U.S. Cl.
  CPC ............... *H01L 2924/12042* (2013.01); *H01L 2924/1431* (2013.01); *H01L 2924/1432* (2013.01); *H01L 2924/1434* (2013.01); *H01L 2924/18161* (2013.01)

(56) References Cited

U.S. PATENT DOCUMENTS

| | | | |
|---|---|---|---|
| 7,355,273 B2 | 4/2008 | Jackson et al. | |
| 8,310,058 B2 | 11/2012 | Lin et al. | |
| 8,405,226 B2 | 3/2013 | Knickerbocker et al. | |
| 8,461,045 B2 | 6/2013 | Hsu et al. | |
| 8,518,741 B1 | 8/2013 | Lu et al. | |
| 8,691,626 B2 | 4/2014 | Su et al. | |
| 8,698,317 B2 * | 4/2014 | Seo | H01L 25/16 257/774 |
| 8,754,514 B2 | 6/2014 | Yu et al. | |
| 8,872,351 B2 | 10/2014 | Moon et al. | |
| 8,884,416 B2 | 11/2014 | Lee et al. | |
| 9,024,426 B2 | 5/2015 | Yeom | |
| 9,721,852 B2 | 8/2017 | Graf et al. | |
| 2011/0210444 A1 * | 9/2011 | Jeng | H01L 23/13 257/738 |
| 2011/0272805 A1 | 11/2011 | Ko | |
| 2011/0272814 A1 * | 11/2011 | Wachtler | H01L 23/49816 257/773 |
| 2012/0098114 A1 | 4/2012 | Ishibashi | |
| 2012/0252632 A1 | 10/2012 | Goeppert | |
| 2013/0015554 A1 | 1/2013 | Lin et al. | |
| 2013/0016477 A1 * | 1/2013 | Yokoya | H01L 23/36 361/719 |
| 2013/0032947 A1 | 2/2013 | Park et al. | |
| 2013/0147043 A1 * | 6/2013 | Gonzalez | H01L 21/568 257/738 |
| 2013/0193996 A1 * | 8/2013 | Zhao | H01L 22/32 324/762.02 |
| 2014/0197522 A1 * | 7/2014 | Gu | H01L 23/5286 257/621 |
| 2015/0206863 A1 | 7/2015 | Graf et al. | |
| 2015/0214191 A1 | 7/2015 | Lee et al. | |
| 2015/0357274 A1 | 12/2015 | Choi et al. | |

OTHER PUBLICATIONS

Non-final office action for U.S. Appl. No. 14/159,449 dated Sep. 24, 2015, 5 pp.
Final office action for U.S. Appl. No. 14/159,449 dated Apr. 7, 2016, 8 pp.
Notice of allowance for U.S. Appl. No. 14/159,449 dated Feb. 3, 2017, 11 pp.
Non-final response dated Dec. 27, 2016, in parent U.S. Appl. No. 14/159,449, to which present application claims priority.
Corrected Notice of Allowability for U.S. Appl. No. 14/159,449 dated Jun. 29, 2017, 8 pp.

* cited by examiner

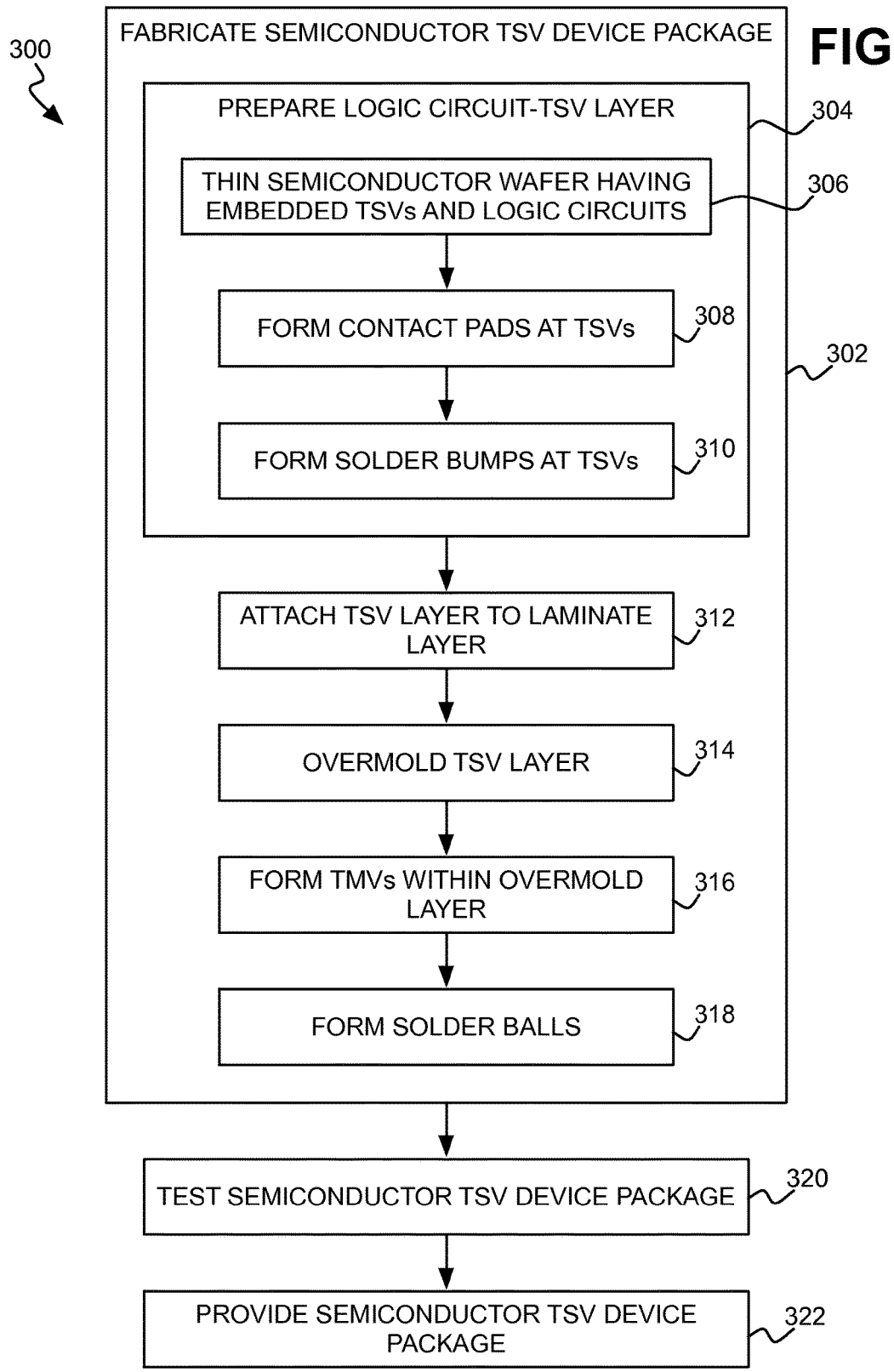

SEMICONDUCTOR TSV DEVICE PACKAGE TO WHICH OTHER SEMICONDUCTOR DEVICE PACKAGE CAN BE LATER ATTACHED

BACKGROUND

Semiconductor devices have become increasingly more complex. Traditionally, more logic circuits have been placed on a semiconductor device die along a two-dimensional plane of the die. More recently, more logic circuits have been placed on a semiconductor device die in a three-dimensional manner as well, via stacking.

SUMMARY

An example semiconductor device includes a laminate layer, and an overmold layer above and in direct contact with the laminate layer. The semiconductor device includes a logic circuit-through-silicon via (TSV) layer including a logic die and TSVs. The logic circuit-TSV layer is within the overmold layer, and the TSVs are electrically exposed at a top surface of the overmold layer.

An example method includes fabricating, by a first party, a semiconductor device package. The semiconductor device package includes a laminate layer, an overmold layer above and in direct contact with the laminate layer, and a logic circuit-TSV layer having a logic die and TSVs. The logic circuit-TSV layer is within the overmold layer, and the TSVs are electrically exposed at a top surface of the overmold layer. The method includes providing the semiconductor device package, by the first party, to a second party for usage by the second party.

Another example method includes receiving, by a second party, a first semiconductor device package fabricated by a first party. The first semiconductor device package includes a laminate layer, an overmold layer above and in direct contact with the laminate layer, and a logic circuit-TSV layer having a first logic die and TSVs. The logic circuit-TSV layer is within the overmold layer, and the TSVs electrically exposed at a top surface of the overmold layer. The method includes attaching, by the second party, a second semiconductor device package to the first semiconductor device package. The second semiconductor device package includes a second logic die.

BRIEF DESCRIPTION OF THE SEVERAL VIEWS OF THE DRAWINGS

The drawings referenced herein form a part of the specification. Features shown in the drawing illustrate only some embodiments of the disclosure, and not of all embodiments of the disclosure, unless the detailed description explicitly indicates otherwise, and readers of the specification should not make implications to the contrary.

FIGS. 3 and 4 are flowcharts of example methods.

DETAILED DESCRIPTION

Figure 1:
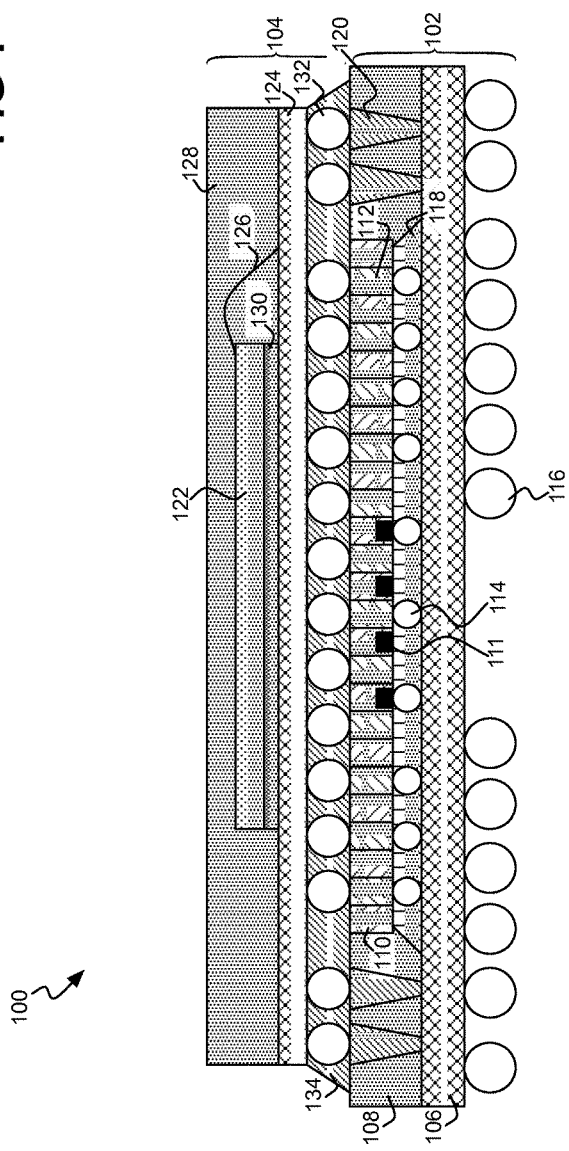
FIG. 1 is a diagram of an example semiconductor device including a semiconductor through-silicon via (TSV) device package to which a top semiconductor device package has been electrically connected.

The following detailed description of exemplary embodiments of the disclosure refers to the accompanying drawings that form a part of the description. The drawings illustrate specific exemplary embodiments in which the disclosure may be practiced. The detailed description, including the drawings, describes these embodiments in sufficient detail to enable those skilled in the art to practice the disclosure. Those skilled in the art may further utilize other embodiments of the disclosure, and make logical, mechanical, and other changes without departing from the spirit or scope of the disclosure.

As noted in the background section, semiconductor devices can have increasing numbers of logic circuits by adding more logic circuits both two dimensionally as well as three dimensionally along the die. To add even more logic circuits, multiple semiconductor logic dies may be packaged within the same semiconductor device. For instance, in mobile communication device implementations, a bottom logic die may be a processor, whereas a top logic die may be memory for use by the processor.

One difficulty with packaging multiple dies within the same semiconductor device is that the entire device has to be assembled before burn-in and other testing of either the bottom or the top logic die can occur. Therefore, yield rates can suffer because a faulty bottom logic die results in the entire semiconductor device being faulty, even if the top logic die is not faulty, and vice-versa. Furthermore, the entire device has to be assembled before being provided to an end customer for usage in an electronic device like a mobile communication device.

Another difficulty is that once the semiconductor device is assembled, neither the top nor bottom logic die can be removed to substitute a different type of die. For example, a customer may offer electronic devices that have processors running at different speeds and that have memory at different capacities. The customer has to order and stock different device combinations for the assumed end purchaser take-in rates of the various combinations. However, such forecasting is notoriously difficult to precisely achieve in practice. The customer may end up having more devices with certain processor-memory combinations that necessary, and may be short on other devices with other processor-memory combinations that have proven to be more in demand.

Techniques disclosed herein alleviate these and other problems. A semiconductor through-silicon via (TSV) device package having a logic die is fabricated, and can separately undergo burn-in and other testing. The semiconductor TSV device package can then be provided to a customer, who can subsequently attach thereto another semiconductor device package having another logic die and that has also already undergone burn-in and other testing. Yield is improved, because just successfully tested semiconductor device packages are attached to just successfully tested semiconductor TSV device packages.

Furthermore, attachment can be made when it is determined what type of resulting electronic device is in demand. For instance, rather ordering and stocking various processor-memory combinations, a customer just has to order and stock the different individual processors and the different individual memory. When it is known that certain processor-memory combinations are needed, the customer can then attach the semiconductor device package including the specified memory to the semiconductor TSV device package including the specified processor.

FIG. 1 shows an example semiconductor device 100. A semiconductor TSV device package 102 has attached thereto a top semiconductor device package 104. The semiconductor TSV device package 102 includes a laminate layer 106 and an overmold layer 108 above and in direction contact with the laminate layer 106. The semiconductor TSV device package 102 includes a logic circuit-TSV layer 110 within the overmold layer 108. The logic circuit-TSV layer 110 includes an integrated logic die having logic circuits 111 disposed at a bottom surface of the layer 110, and further has a number of TSVs 112 electrically exposed at the top surface of the overmold layer 108 (e.g., under contact pads or other metallization not shown in FIG. 1). The logic circuits 111 can be selectively electrically connected to the TSVs 112 within the logic circuit-TSV layer 110.

Solder bumps 114 of the semiconductor TSV device package 102 electrically connect at least some of the TSVs 112 of the logic circuit-TSV layer 110 to the laminate layer 106. The solder bumps 114 can also electrically connect one or more of the logic circuits 111 to the laminate layer 106. That is, each solder bump 114 connects one of the TSVs 112 or one of the logic circuits 111 to the laminate layer 106. Not all TSVs 112 have to be connected to the laminate layer 106 via solder bumps 114, and similarly not all logic circuits 111 have to be connected to the laminate layer 106 via solder bumps 114.

Solder balls 116 of the semiconductor TSV device package 102, which are larger than the solder bumps 114, are at the bottom surface of the laminate layer 106. The solder balls 116 permit the semiconductor device 100 to be connected within an electronic device, such as to a logic board thereof. The overmold layer 108 may include an underfill layer 118 within which the solder bumps 114 are disposed. In another implementation, the material of the overmold layer 108 can fill the area beneath the logic-circuit TSV layer 110, such that the same material acts as both the overmold layer 108 and the underfill layer 118.

The overmold layer 108 of the semiconductor TSV device package 102 can also include a number of through-mold vias (TMVs) 120 to either or both sides of the logic circuit-TSV layer 110. The TMVs 120 are electrically exposed at the top and bottom surfaces of the overmold layer 108. If the TMVs 120 are not present, the resulting semiconductor device 100 is smaller in area, which is an advantage of the techniques disclosed herein. The TMVs 120 are electrically connected to the laminate layer 106, providing a direct electrical connection to the solder balls 116 and/or to the solder bumps 114.

In the example of FIG. 1, the top semiconductor device package 104 has a wire-bond configuration, in which there is a logic die 122 that is electrically connected to a laminate layer 124 via bonding wires 126 within an overmold layer 128, where the logic die 122 is affixed to the laminate layer 124 via an adhesive layer 130. However, this is just for example purposes. More generally, the top semiconductor device package 104 can be any type of semiconductor device package, and indeed there can be more than one semiconductor device package mounted to the semiconductor TSV device package 102. One example is a wafer-level chip-scale package (WLCSP) with or without a redistribution layer (RDL). The top semiconductor device package 104 can in another implementation contain a flip chip die, or multiple wire-bond and/or flip chip dies in a stacked die configuration.

The top semiconductor device package 104 includes solder balls 132. The solder balls 132 electrically connect the top semiconductor device package 104 to the semiconductor TSV device package 102. Specifically, the solder balls 132 are attached to metallization on the top surface of the logic circuit-TSV layer 110 of the semiconductor TSV device package 102, to electrically connect the solder balls 132 and thus the top semiconductor device package 104 to the TSVs 112 and/or to the logic circuits 111. If the TMVs 120 are present within the overmold layer 108, some of the solder balls 132 are instead electrically connected to the TMVs 120. The solder balls 132 may be disposed within an underfill layer 134 between the device packages 102 and 104 (or of the top semiconductor device package 104). It is noted that such metallization may be in the form of an RDL, permitting the solder balls 132 to connect to TSVs 112 in particular that may not be directly underneath them (i.e., for routing purposes).

Figure 2:
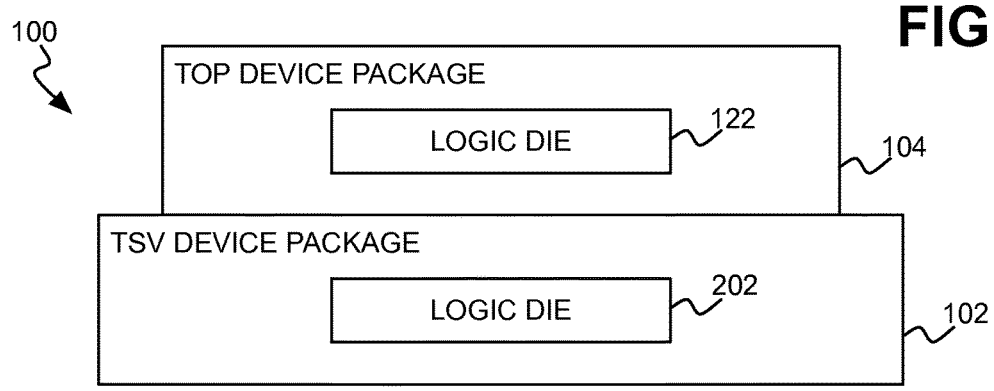
FIG. 2 is a block diagram of the example semiconductor device of FIG. 1 in more general detail.

FIG. 2 shows a block diagram of the example semiconductor device 100. The top semiconductor device package 104 is electrically connected to the semiconductor TSV device package 102. The resulting semiconductor device 100 thus has two logic dies: the logic die 122 of the device package 104 and a logic die 202 of the device package 102, the latter which is within the logic circuit-TSV layer 110 and that includes the logic circuits 111 of FIG. 1. As just one example, the logic die 122 may be memory and the logic die 202 may be a processor that uses the memory. Different types of the device packages 102 and 104 can be fabricated and tested, and then a particular type of the top semiconductor device package 104 attached to a particular type of the semiconductor TSV device package 102 as needed to form a desired semiconductor device 100.

FIG. 3 shows a first example method 300. The example method 300 may be performed at least in part by a party that fabricates a semiconductor TSV device package and then provides it to another party, like a customer that uses the semiconductor TSV device package in accordance with another, top semiconductor device package within its electronic device. The semiconductor TSV device package is thus fabricated (302).

Fabrication of the semiconductor TSV device package in part 302 includes preparing a logic circuit-TSV layer (304). Logic circuit-TSV layer preparation can include thinning a semiconductor wafer having the logic die within which TSVs are embedded to physically expose the TSVs at the side of the wafer to which a top semiconductor device package will be subsequently mounted (306). It is noted that the logic circuits themselves remain at the other side of the wafer that will be mounted to a laminate layer. Contact pads are formed at the side the wafer that will remain exposed within the semiconductor TSV device package for subsequent connection to a top semiconductor device package (308), such that the TSVs remain electrically exposed at this side of the wafer via the contact pads, which are a form of metallization. Contact pad formation can be achieved with or without an RDL. Solder bumps are formed on the opposite side of the TSVs that will be connected to the laminate layer of the semiconductor TSV device package (310).

After the logic circuit-TSV layer has been prepared in part 304, the logic circuit-TSV layer is attached to a laminate layer (312), via the solder bumps. As part of the logic circuit-TSV layer-to-laminate layer attachment process, an underfill layer may be formed to encapsulate the solder bumps. The logic circuit-TSV layer after attachment to the laminate layer is overmolded while keeping the metallization exposed at the top surface of the overmold layer that is resultantly formed (314). TMVs may be formed within the overmold layer as well (316), such as by laser ablation. Solder balls are formed on the bottom surface of the laminate layer (318).

After the semiconductor TSV device package has been fabricated in part 302, it may undergo testing (320), such as burn-in, to verify that the logic die therewithin is fully functional prior to usage of the semiconductor TSV device package by attaching a top semiconductor package thereto. The semiconductor TSV device package is then provided to the party that will use the package in an electronic device by attaching a top semiconductor device package thereto (322). This party may be the same or a different party as that which performed part 302 and/or part 304.

Figure 4:
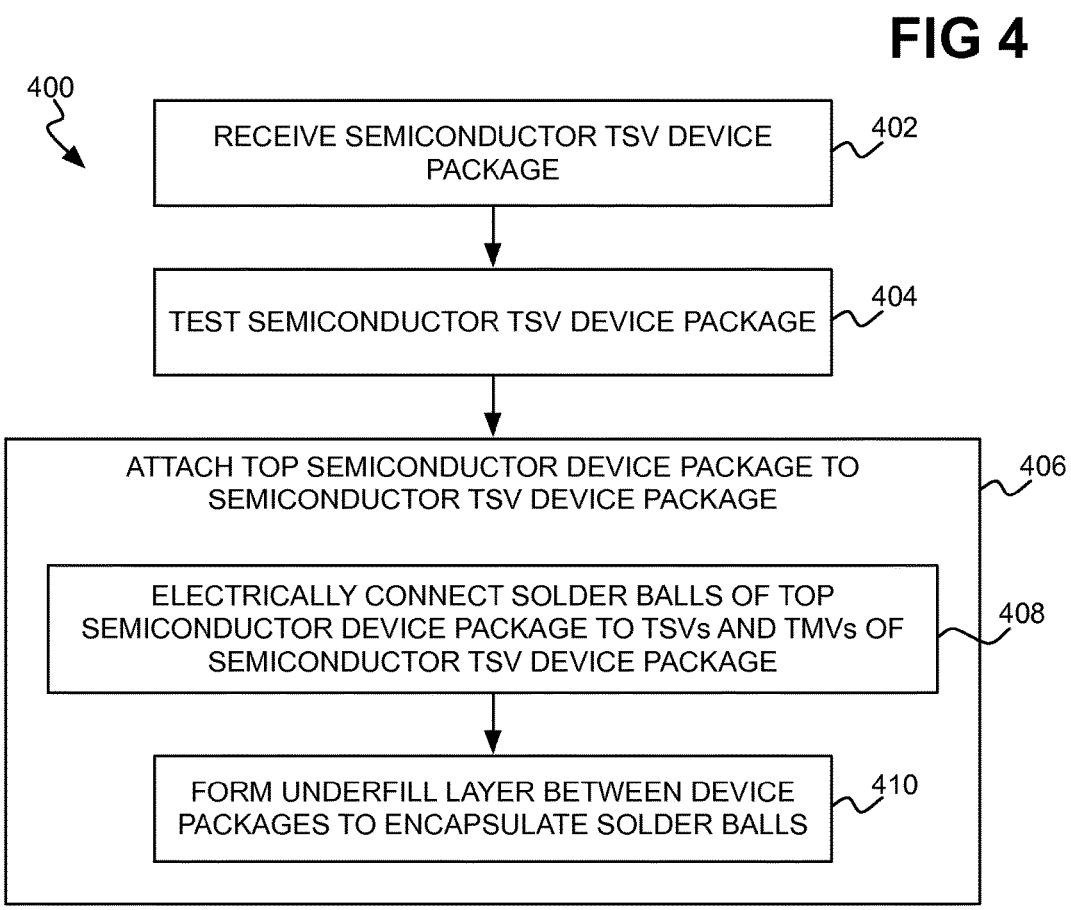

FIG. 4 shows a second example method 400. The example method 400 may be performed at least in part by a party, like a customer, which uses a semiconductor TSV device package in accordance with another, top semiconductor device package, such as within an electronic device. The semiconductor TSV device package is thus received (402). The semiconductor TSV device package may be tested (404), especially if the device package was not tested in part 320 after fabrication during the method 300.

A top semiconductor device package is then attached to the semiconductor TSV device package to yield a complete semiconductor device (406). The attachment process of part 406 includes electrically connecting solder balls of the top semiconductor device package to TSVs—and to TMVs if present—of the semiconductor TSV device package (408). An underfill layer may also be formed between the device packages to encapsulate these solder balls (410). It is noted that attachment of the top semiconductor device package to the semiconductor TSV device package can be performed at the same time the semiconductor TSV device package is attached to a logic board, such that the complete semiconductor device is effectively attached to the logic board at the same time. This scenario can be advantageous, so that a single reflow process can be used for both top device package-to-TSV device package joinder and TSV device package-to-logic board joinder.

It is noted that prior to the top semiconductor device package being attached to the semiconductor TSV device package, the semiconductor TSV device package may be unusable within an electronic device. This is at least because the TSVs are electrically exposed at the top surface of the semiconductor TSV device package (via physically exposed metallization such as contact pads), and further because these TSVs may have to be connected for portions of the logic die to be operable in the electronic device. Furthermore, it is noted that the semiconductor TSV device package is to have the top semiconductor device package attached thereto before the resultantly complete semiconductor device is electrically connected within an electronic device, such as to a logic board thereof.

It is finally noted that, although specific embodiments have been illustrated and described herein, it will be appreciated by those of ordinary skill in the art that any arrangement calculated to achieve the same purpose may be substituted for the specific embodiments shown. This application is thus intended to cover any adaptations or variations of embodiments of the present invention. As such and therefore, it is manifestly intended that this invention be limited only by the claims and equivalents thereof.

We claim:

1. A method comprising:
fabricating a semiconductor device package including a laminate layer, an overmold layer above and in direct contact with the laminate layer, and a logic circuit-through-silicon via (TSV) layer having a logic die and a plurality of TSVs, the logic circuit-TSV layer within the overmold layer, the TSVs electrically exposed at a top surface of the overmold layer, comprising:
preparing the logic circuit-TSV layer including the logic die, comprising:
thinning a semiconductor wafer within which the TSVs are embedded to physically expose the TSVs at a side of the semiconductor wafer;
forming a plurality of contact pads at a side of the TSVs that will remain electrically exposed at the top surface of the overmold layer during the overmolding; and
forming a plurality of solder bumps on an opposite side of the TSVs that will be connected to the laminate layer during attachment of the logic circuit-TSV layer to the laminate layer;
attaching the logic circuit-TSV layer to the laminate layer;
overmolding the logic circuit-TSV layer as attached to the laminate layer while keeping the TSVs electrically exposed at the top surface of the overmold layer being formed;
forming a plurality of solder balls on a bottom surface of the laminate layer.

2. The method of claim 1, further comprising testing the semiconductor device package to verify that the logic die therewithin is fully functional.

3. The method of claim 1, wherein fabricating the semiconductor device package further comprises forming a plurality of through-mold vias (TMVs) within the overmold layer to one or more sides of the logic circuit-TSV layer.

4. A method comprising:
receiving a first semiconductor device package fabricated and tested, the first semiconductor device package including a laminate layer, an overmold layer above and in direct contact with the laminate layer, and a through-silicon via (TSV) layer having a first logic die and a plurality of TSVs, the logic circuit-TSV layer within the overmold layer, the TSVs electrically exposed at a top surface of the overmold layer; and
attaching a second semiconductor device package that has been fabricated and tested to the first semiconductor device package, the second semiconductor device package including a second logic die,
wherein the first semiconductor device package is fabricated prior to being received by:
preparing the logic circuit-TSV layer including the logic die, comprising:
thinning a semiconductor wafer within which the TSVs are embedded to physically expose the TSVs at a side of the semiconductor wafer;
forming a plurality of contact pads at a side of the TSVs that will remain electrically exposed at the top surface of the overmold layer during the overmolding; and
forming a plurality of solder bumps on an opposite side of the TSVs that will be connected to the laminate layer during attachment of the logic circuit-TSV layer to the laminate layer;
attaching the logic circuit-TSV layer to the laminate layer;
overmolding the logic circuit-TSV layer as attached to the laminate layer while keeping the TSVs electrically exposed at the top surface of the overmold layer being formed;
forming a plurality of solder balls on a bottom surface of the laminate layer.

5. The method of claim 4, further comprising testing the first semiconductor device package prior to attaching the second semiconductor device package to the first semiconductor device package.

6. The method of claim 4, wherein attaching the second semiconductor device package to the first semiconductor device package comprises electrically connecting a plurality of solder balls of the second semiconductor device package to the first semiconductor device package at the TSVs of the first semiconductor device package.

7. The method of claim 6, wherein attaching the semiconductor device package to the first semiconductor device package further comprises forming an underfill layer between the first semiconductor device package and the second semiconductor device package to encapsulate the solder balls.

8. The method of claim 6, wherein the first semiconductor device package further comprises a plurality of through-mold vias (TMVs) within the overmold layer to one or more sides of the logic circuit-TSV layer, and attaching the semiconductor device package to the first semiconductor device package further comprises electrically connecting a plurality of additional second balls of the second semiconductor device package to the first semiconductor device package at the TMVs of the first semiconductor device package.

9. A method comprising:

fabricating a semiconductor device package including a laminate layer, an overmold layer above and in direct contact with the laminate layer, and a logic circuit-through-silicon via (TSV) layer having a logic die and a plurality of TSVs, the logic circuit-TSV layer within the overmold layer, the TSVs electrically exposed at a top surface of the overmold layer, including preparing the logic circuit-TSV layer including the logic die by:

thinning a semiconductor wafer within which the TSVs are embedded to physically expose the TSVs at a side of the semiconductor wafer;

forming a plurality of contact pads at a side of the TSVs that will remain electrically exposed at the top surface of the overmold layer during the overmolding; and forming a plurality of solder bumps on an opposite side of the TSVs that will be connected to the laminate layer during attachment of the logic circuit-TSV layer to the laminate layer.

10. The method of claim 9, further comprising testing the semiconductor device package to verify that the logic die therewithin is fully functional.

11. The method of claim 9, wherein fabricating the semiconductor device package further comprises:

attaching the logic circuit-TSV layer to the laminate layer;

overmolding the logic circuit-TSV layer as attached to the laminate layer while keeping the TSVs electrically exposed at the top surface of the overmold layer being formed; and forming a plurality of solder balls on a bottom surface of the laminate layer.

12. The method of claim 11, wherein fabricating the semiconductor device package further comprises forming a plurality of through-mold vias (TMVs) within the overmold layer to one or more sides of the logic circuit-TSV layer.

* * * * *